United States Patent
Maede et al.

(10) Patent No.: US 7,477,217 B2
(45) Date of Patent: Jan. 13, 2009

(54) D/A CONVERTER CIRCUIT, ORGANIC EL DRIVE CIRCUIT AND ORGANIC EL DISPLAY DEVICE

(75) Inventors: Jun Maede, Kyoto (JP); Shinichi Abe, Kyoto (JP); Akio Fujikawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 854 days.

(21) Appl. No.: 10/948,237

(22) Filed: Sep. 24, 2004

(65) Prior Publication Data

US 2005/0067969 A1    Mar. 31, 2005

(30) Foreign Application Priority Data

Sep. 30, 2003    (JP)    ............... 2003-339531

(51) Int. Cl.
*G09G 3/30*    (2006.01)
(52) U.S. Cl. ..................................... 345/76; 341/135
(58) Field of Classification Search ............. 341/135, 341/136; 257/72, 69; 345/76, 82, 98, 204; 348/800
See application file for complete search history.

(56) References Cited

U.S. PATENT DOCUMENTS

| | | | | |
|---|---|---|---|---|
| 5,055,844 | A | * | 10/1991 | Kasai ..................... 341/144 |
| 5,065,159 | A | * | 11/1991 | Kuwana ................... 341/148 |
| 6,756,738 | B2 | | 6/2004 | Maede et al. |
| 6,967,604 | B2 | * | 11/2005 | Maede et al. .............. 341/135 |
| 6,992,647 | B2 | * | 1/2006 | Hanada et al. .............. 345/76 |

FOREIGN PATENT DOCUMENTS

JP    2003-234655    8/2003

OTHER PUBLICATIONS

Hisamoto et al., A Folded-channel MOSFET for deep-sub-tenth micron era, Dec. 6, 1998, IEEE, on pp. 1032-1034.*

* cited by examiner

*Primary Examiner*—Abbas I Abdulselam
(74) *Attorney, Agent, or Firm*—Mattingly, Stanger, Malur & Brundidge PC

(57) ABSTRACT

A current mirror type D/A converter circuit is constructed with transistor cells each including a MOS transistor, a gate region of which MOS transistor has folded stripe configuration in a plan view thereof, or a current flowing direction in a channel of which is a folded stripe in plan view.

2 Claims, 6 Drawing Sheets

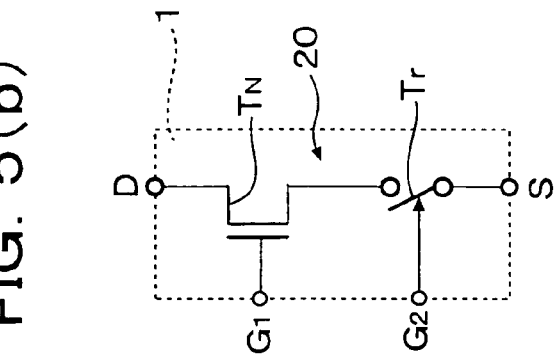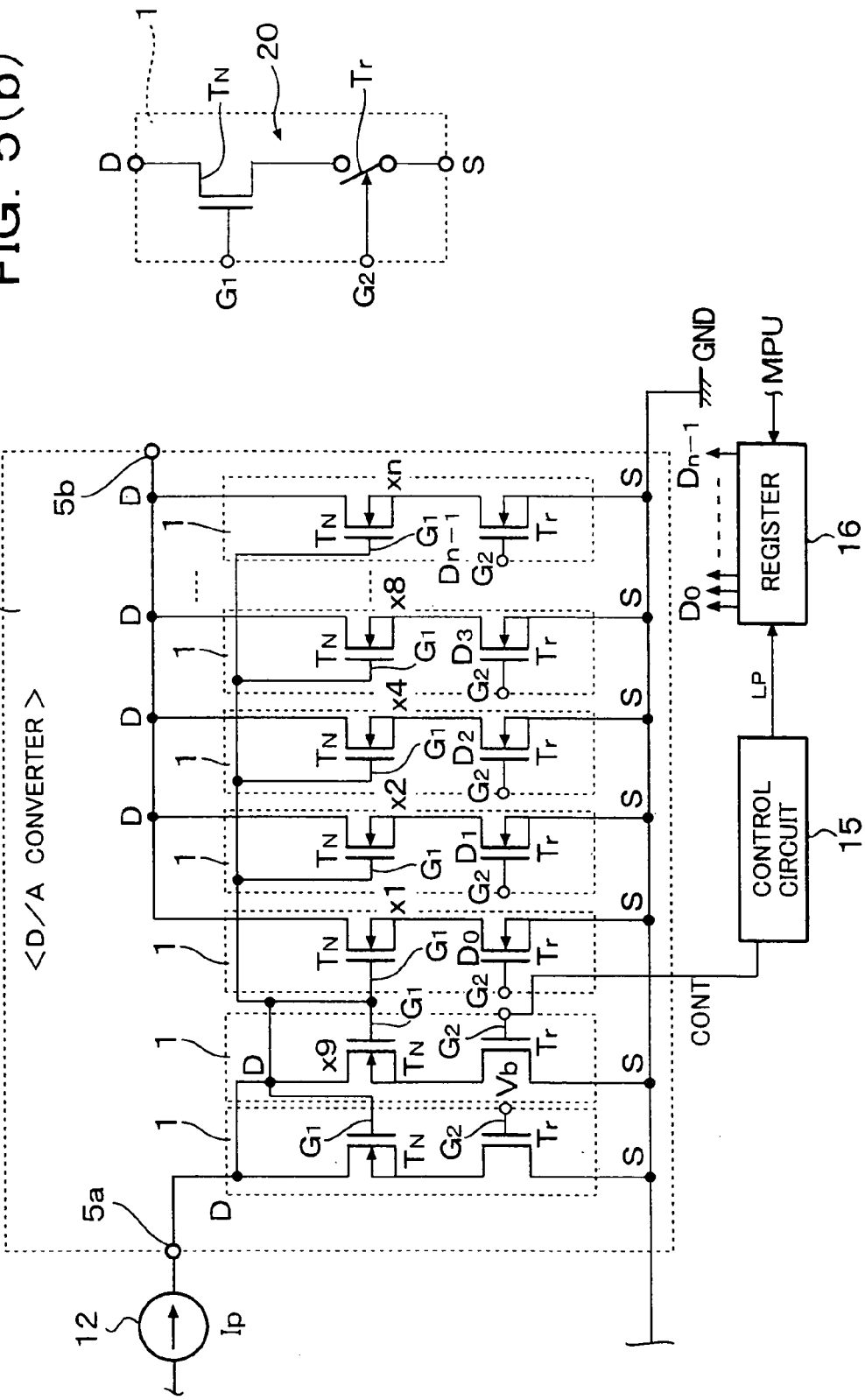

D/A CONVERTER CIRCUIT, ORGANIC EL DRIVE CIRCUIT AND ORGANIC EL DISPLAY DEVICE

BACKGROUND OF THE INVENTION

1. Field of the Invention

The present invention relates to a D/A converter circuit, an organic EL drive circuit and an organic EL display device. Particularly, in a current drive circuit for generating a drive current in a column direction or a current, from which the drive current is generated, by D/A converting display data corresponding to column pins of an organic EL panel, the present invention relates to an improvement of an organic EL drive circuit and an organic EL display device, which are capable of restricting luminous irregularity of a display screen due to irregularity of conversion characteristics of a D/A converter circuit.

2. Description of the Related Art

An organic EL display panel of an organic EL display device for use in a portable telephone set, a PHS, a DVD player, PDA (portable digital assistances), etc., including 396 (132×3) terminal pins (column pins) for column lines and 162 terminal pins for row lines has been proposed. These numbers of the terminal pins for column lines and row lines are still increasing.

JP2003-234655A assigned to the assignee of this application and U.S. Pat. No. 6,756,738 also assigned to the assignee of this application disclose drive circuits for corresponding column pins of such organic EL display panel, in each of which a D/A converter circuit is provided. In U.S. Pat. No. 6,756,7378, the D/A converter circuits are responsive to display data and a reference current to generate drive current in a column direction or a current on which the drive current is derived, by D/A converting the display data correspondingly to the column pins of the organic EL display panel according to the reference current. Particularly, when the organic EL display panel is of the passive matrix type, peak currents are generated to drive organic EL elements having capacitive load characteristics by initially charging the elements.

FIG. 6 is an example of a D/A converter circuit provided corresponding to column pins of a drive circuit of an organic EL display panel and constructed with MOS FETs mainly and corresponds to FIG. 1 of U.S. Pat. No. 6,756,738.

The D/A converter circuit 11 of the current drive circuit is the so-called a current switching D/A converter circuit and is constructed with a current mirror circuit. The D/A converter circuit 11 includes an input side transistor TNa to which a reference current Ip is inputted from a constant current source 12 through an input terminal 11a and output side transistors TNb~TNn−1 to which display data D0~Dn−1 are supplied from a register 16. The input side transistor TNa and the output side transistors TNb~TNn−1 constitute a current mirror circuit. The D/A converter 11 multiplies the reference current Ip with the display data. In order to generate peak current, the D/A converter 11 further includes an N channel MOS transistor TNp connected in parallel to the transistor TNa.

A gate and a drain of the MOS transistor TNp are connected to the input terminal 11a. Sources of the transistor TNa and the MOS transistor TNp are grounded through resistors Ra and Rpa and switch circuits SWa and SWpa, respectively. The switch circuits SWa and SWpa are ON/OFF controlled by pulse signals P and CONT from a control circuit 15. In response to the reference current Ip, the D/A converter circuit 11 generate the peak current when the switch circuits SWa and SWpa are turned ON and OFF, respectively. When both of the switch circuits SWa and SWpa are turned ON, the D/A converter circuit 11 outputs the constant current corresponding to the reference current.

Incidentally, resistors Rb~Rn−1 provided in a downstream side of the output transistors TNb~TNn−1 function to balance the operating current of the current mirror circuit and the N channel transistors TNb~TNn−1 provided in the downstream side of the resistors Rb~Rn−1 are switching transistors, which are ON/OFF controlled by the display data D0~Dn−1.

The output side transistors TNb~TNn−1 have drains connected to output terminals 11b of the D/A converter circuit 11 and gate widths (channel widths) of the transistors TNb~TNn−1 with respect to a gate width (channel width) of the input side transistor TNa correspond to weights, for example, 1, 2, 4,~, n of respective columns. The gate widths (channel widths) corresponding to the weights of the respective columns are usually formed by connecting a plurality of unit transistors, which are formed as transistor cells in parallel.

An output stage current source 13 is constructed with a drive level shifter circuit 13a and an output stage current mirror circuit 13b.

The drive level shifter circuit 13a functions to transmit the output current of the D/A converter circuit 11 to the output stage current mirror circuit 13b and is constructed with an N channel MOS transistor TNv. The transistor TNv has a gate connected to a bias line Vb, a source connected to the output terminal 11b and a drain connected to an input terminal 13c of the output stage current mirror circuit 13b.

The output stage current mirror circuit 13b includes P channel MOS transistors TPu and TPw and P channel MOS transistors TPx and TPy, which constitute an output stage current mirror circuit. The drive current is outputted from a drain of the transistor TPy to the organic EL element 4 through an output pin 9.

Such current drive circuit generates a drive current in column direction or a current on which the drive current is generated by D/A converter circuit according to the reference current Ip. The D/A converter circuit is constructed with a number of transistor cells. Therefore, variation of D/A conversion characteristics of the D/A converter circuit cause variation of output currents of the column pins, resulting in luminous irregularity and luminous variation on the display screen.

Since such luminous irregularity and variation can not be absorbed by regulating the reference current value, it is necessary to provide, in the D/A converter circuit, a regulator circuit for regulating the converted current value. Since such regulator circuit has to be provided for each column pin, the circuit size of the D/A converter circuit has to be increased with increase of the number of elements of the regulator circuit, so that it is difficult to form the current drive circuits in an IC.

SUMMARY OF THE INVENTION

An object of the present invention is to provide a D/A converter circuit, which, when a plurality of D/A converter circuits each including a current mirror circuit constructed with a number of transistor cells are provided, is capable of reducing variation of output currents due to variation of D/A conversion characteristics of the D/A converter circuits.

Another object of the present invention is to provide an organic EL drive circuit, which uses a D/A converter circuit including a current mirror circuit having a plurality of transistor cells, capable of reducing luminous irregularity and luminous variation on a display screen of an organic EL display panel.

Another object of the present invention is to provide an organic EL display device including an organic EL drive circuit capable of reducing luminous irregularity and luminous variation on a display screen of an organic EL display panel.

In order to achieve the above mentioned objects, a D/A converter, an organic EL drive circuit and an organic EL display device according to the present invention is featured by that the current mirror circuit constituting the D/A converter circuit includes a plurality of transistor cells each including a MOS transistor, a gate region of which has folded stripe configuration in a plan view thereof, or a current flowing direction in a channel of which is a folded stripe in plan view.

Incidentally, variation ΔI of output side current with respect to a predetermined drive current I in the current mirror circuit using MOS transistors can be represented by the following equation (1):

$$\Delta I = I \cdot 2\Delta Vth/(VGS-Vth) \quad (1)$$

where VGS is gate-source voltage of the MOS transistor, Vth is threshold voltage of the MOS transistor, ΔVth is a difference between a threshold voltage, which is a design reference of the MOS transistor, and the threshold voltage Vth.

The difference (VGS−Vth) between the gate-source voltage and the threshold voltage Vth can be represented by the following equation (2):

$$VGS-Vth = \sqrt{(2/\mu n Cox) \cdot (L/W) \cdot ID} \quad (2)$$

where μn is electron mobility, Cox is capacitance of unit area of a gate oxide film, ID is drain current, L is channel length and W is channel width.

As described previously, the number of drive pins tends to be increased with increase of request of higher display resolution. Since power consumption increases when the number of drive pins is increased, it is required to reduce the power consumption. In order to achieve the reduction of power consumption, it is necessary to restrict the operating source voltage of the D/A converter circuit to, for example, 3V or lower. Therefore, it is impossible to increase the gate-source voltage VGS.

Assuming that drain current ID is constant, variation ΔI can be reduced by making (VGS−Vth) larger. In order to increase (VGS−Vth), it is necessary to increase L/W. In other words, it is necessary to reduce W/L, a reciprocal of L/W.

According to the present invention, a number of MOS transistor cells each having a gate region in a bent stripe form or a striped channel in which a current flowing direction in the gate region is folded or turned over in plane view and a D/A converter circuit is constructed with a current mirror circuit constructed with these transistor cells. Thus, it is possible to construct a current mirror circuit with transistors each having large channel length L and, so, it is possible to reduce W/L.

Further, the configuration of the transistor cell (unit transistor) can be made not rectangular but substantially square. Therefore, the distance between adjacent transistor cells can be reduced and integration efficiency can be improved. Further, with these effects, it is possible to arrange the transistors constituting the current mirror circuit with reduced distance between transistors. As a result, it is possible to improve the pairing of transistors constituting the current mirror circuit in view of characteristics thereof and to improve preciseness of output current of the D/A converter circuit.

Thus, according to the present invention, the organic EL drive circuit including a number D/A converter circuits each utilizing a current mirror circuit can reduce variation of output currents of the D/A converter circuits due to variation of the D/A converting characteristics. Further, according to the organic EL drive circuit having the D/A converter circuits provided for respective terminal pins of the organic EL display panel and the organic EL display device using the organic EL drive circuit, it is possible to restrict luminous irregularity and variation of the display screen due to variation of conversion characteristics of the D/A converter circuits.

BRIEF DESCRIPTION OF THE DRAWINGS

FIG. 5(a) is a circuit diagram of an example of the current mirror type D/A converter circuit;

FIG. 5(b) is an equivalent circuit of the transistor cell; and

DETAILED DESCRIPTION OF THE PREFERRED EMBODIMENTS

Figure 1:
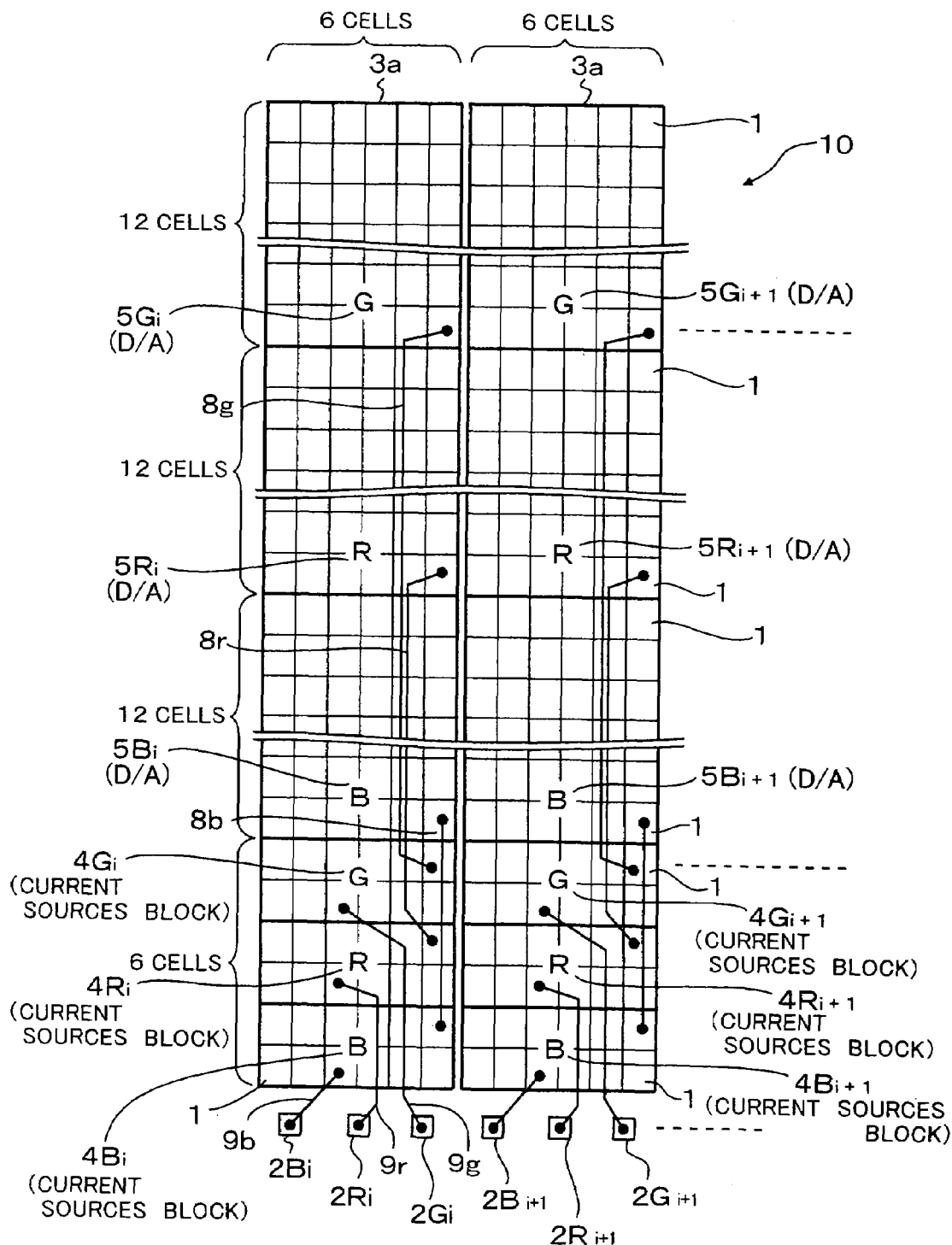
FIG. 1 shows a layout of transistor cells, which constitute current mirror circuits of an output stage current source and a current mirror type D/A converter circuit of a current drive circuit according to an embodiment of the present invention.

In FIG. 1, a layout 10 of transistor cells (unit transistor circuits) 1 constituting a current mirror circuit corresponds to a region of a column drive IC of an organic EL drive circuit in which D/A converter circuits provided correspondingly to column pins and an output stage current source are formed.

Figure 2A:
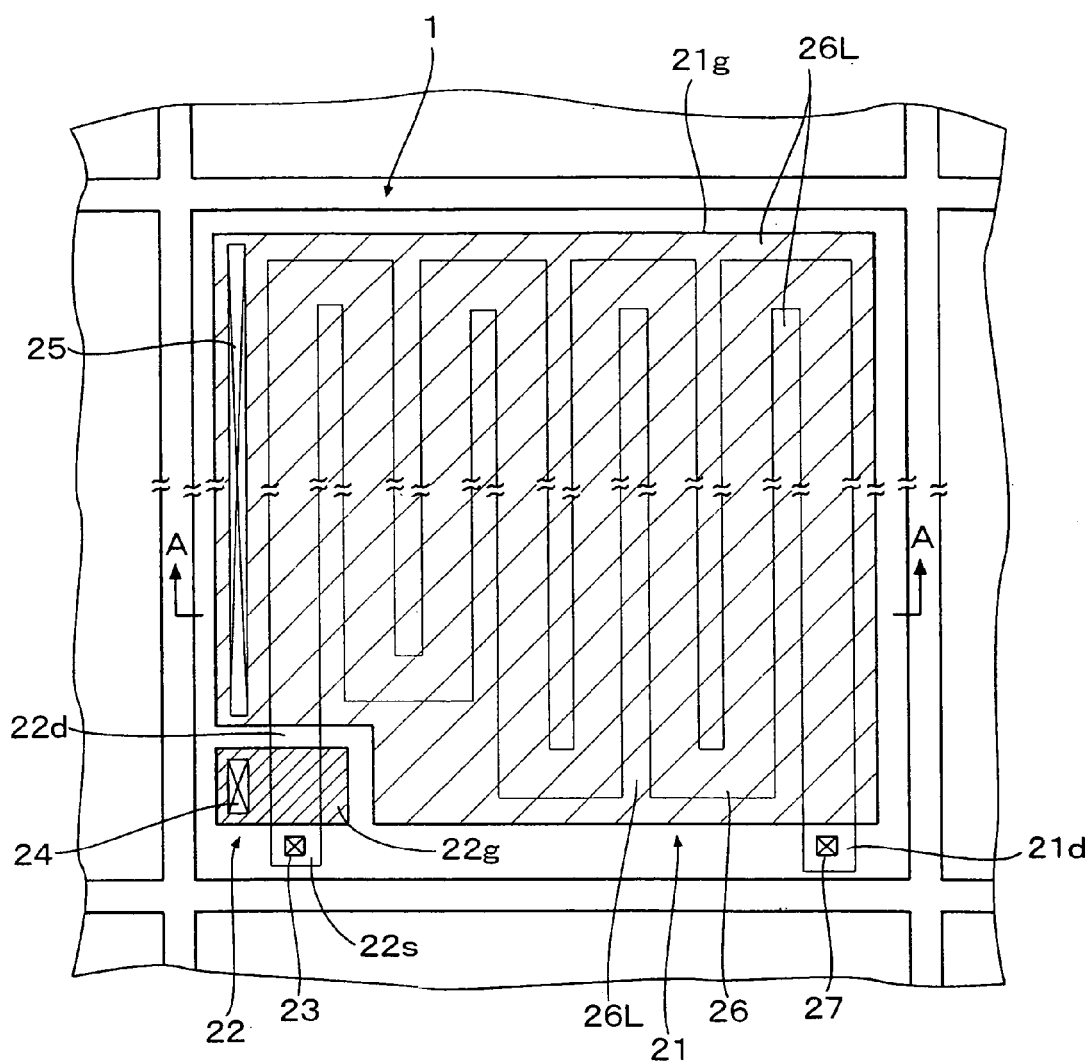
FIG. 2(a) is a plan view of one of the transistor cells of the current mirror type D/A converter circuit.
Figure 2B:
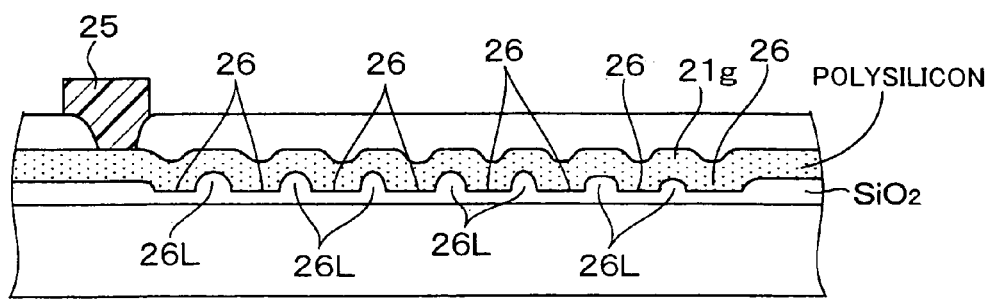
FIG. 2(b) is a cross sectional view taken along a line A-A in FIG. 2(a)
Figure 6:
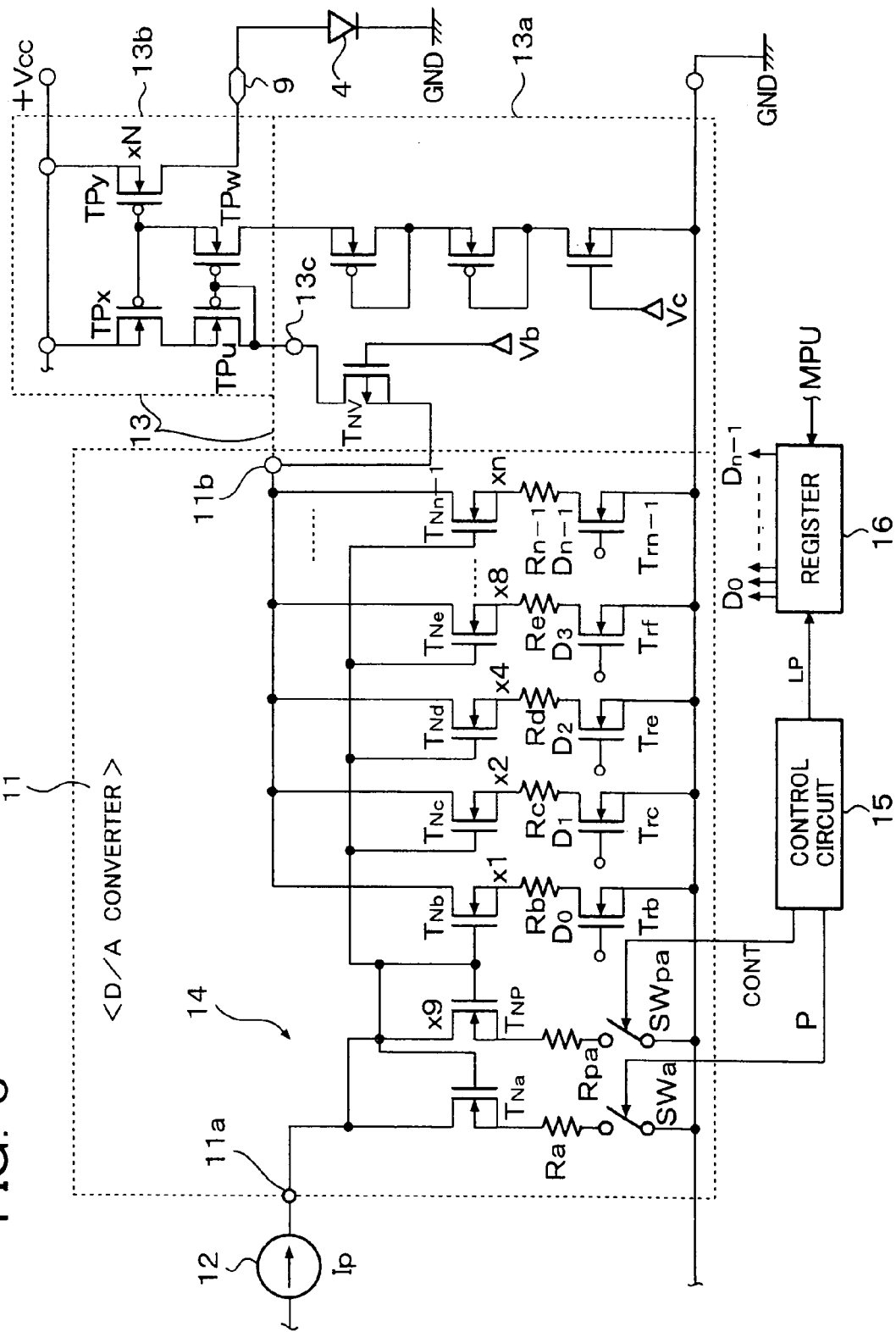
FIG. 6 is a circuit diagram of an example of the D/A converter circuit provided for column pins of a drive circuit of an organic EL display panel.

In order to constitute the current mirror circuit including the D/A converter circuit 11 and the output stage current source 13 shown in FIG. 6 by using the layout 10 of the transistor cells 1 shown in FIG. 1, the D/A converter circuit 11 shown in FIG. 6 is changed to a D/A converter circuit 5 shown in FIG. 1 by removing the resistors Ra~Rn-1 as shown in FIG. 5(a) and each transistor cell 1 is constructed with a series circuit of an N channel MOS transistor TN for outputting current and an N channel MOS transistor Tr for forming a switch circuit as shown in FIG. 5(b). Further, as the transistor TN of the transistor cell 1, a serpentine type transistor 21, which has a folded stripe shaped channel in plan view as shown in FIG. 2(a) and FIG. 2(b), is used.

In the D/A converter circuit shown in FIG. 5(a), the transistor cells 1 are used as respective two input side transistors and a number of output side transistors of the current mirror circuit. One of the display data bits is inputted to a gate G2 of the transistor Tr of the output side transistor cell 1 and is ON/OFF controlled according to the value of the 1 bit data. Drains of the two input side transistor cells 1 are connected to an input terminal 5a of the D/A converter circuit 5 and drains of the output side transistor cells 1 are connected to an output terminal 5b of the D/A converter circuit 5. An analog current converted by the D/A converter circuit 5, which corresponds to the display data, is generated at the output terminal 5*b*. Gates G1 of the transistors TN are commonly connected to the input terminal 5*a*. A source S of each transistor cell 1 (source S of the transistors Tr) is grounded.

As shown by the layout 10 in FIG. 1, a plurality of the transistor cells 1 are arranged in each rectangular transistor arranging block 3*a* having lengthwise direction (column direction) perpendicular to a pad arranging direction (row direction) and connected to respective column pins of the organic EL drive circuit.

A total number of the transistor cells in each transistor arranging block 3*a* is 252 (42×6). The transistor arranging blocks 3*a* are repeatedly formed in the pad arranging direction (row direction) with pitch corresponding to 3 pads. In each transistor forming block 3*a*, 2 rows of the transistor cells 1 correspond to each pad. The current mirror circuits for B, R and G are formed by transistor cells selected in the transistor arranging blocks 3*a* with 3 pad pitch as unit.

In the layout 10 shown in FIG. 1, the D/A converter circuits 5 constituting the current mirror circuits are formed with the transistor cells 1 in regions of D/A converter circuits 5Bi, 5Ri and 5Bi correspondingly to R, G and B, respectively. Each of the D/A converter circuits 5Bi, 5Ri and 5Gi formed with the transistor cells 1 corresponds to the D/A converter circuit 11 shown in FIG. 6 with the resistors Ra and Rpa and the resistors Rb to Rn−1 in FIG. 6 being removed so that the input side transistors TNa and TNp are directly connected to the switch circuits SWa and SWpa, respectively, and the upstream side output side transistors TNb~TNn−1 are directly connected to the transistors Tra to Trn−1, respectively.

As a result, it is possible to constitute the input side and the output side circuits of the current mirror circuit with the series circuits of the N channel MOS transistor TN, which outputs current, and the N channel MOS transistor Tr, which has a source connected to a drain of the transistor TN and functions as a switch circuit, as shown in FIG. 5(*b*), as a unit circuit.

In a portion of the transistor arranging block 3*a* on the side of the pads 2, current sources blocks 4Bi, 4Ri and 4Gi are provided as regions of current mirror circuits constituting the output stage current source 13. The region including 12 (2×6) transistor cells for B (blue) is assigned to the current source block 4Bi. In the current source block 4Bi, the current mirror circuit is constructed with ten (10) of the 12 transistor cells in an upper wiring layer. An output of the current mirror circuit formed in the current source block 4Bi is connected to the pad 2Bi through an upper layer wiring line 9*b*. In the current source block 4Bi, the remaining 2 transistor cells are used as spare transistor cells or dummy transistor cells.

Behind the current source block 4Bi, the current source block 4Ri including 12 (2×6) transistor cells as a region in which the current mirror circuit for R (red) is formed. 10 of the 12 transistor cells in the region are assigned to the circuit mirror circuit output of which is connected to the pad 2Ri through an upper wiring line 9*r*.

Further behind the current source block 4Ri, the current source block 4Gi including 12 (2×6) transistor cells is assigned to a region in which the current mirror circuit for G (green) is formed as shown. Ten (10) of the 12 transistor cells in the region are assigned to the circuit mirror circuit output of which is connected to the pad 2Gi through an upper wiring line 9*g*.

Behind the current source block 4Gi, three (3) blocks each including 72 (12×6) transistor cells, in which current mirror type D/A converter circuits are provided. These blocks correspond to B, R and G, respectively, and assigned as D/A converter circuit blocks 5Bi, 5Ri and 5Gi, respectively. Each of the D/A converter circuits includes 70 transistor cells and the remaining two (2) transistor cells are spare or dummy transistor cells.

Incidentally, the number of transistor cells (unit transistors), which is 252, is obtained by converting a transistor or a transistor cell, which has an area substantially 2 times or n times an area of the unit transistor and is formed locally in the transistor cell region, into 2 or n transistors or transistor cells, in which current mirror circuits are provided. Conversely, when 2 or n transistors or transistor cells, whose area is one n-th an area of the unit transistor, where n is an integer, are formed locally, the number 252 is obtained by converting all of the transistors or transistor cells into 1, in which current mirror circuits are provided.

An output terminal of the D/A converter circuit in the block 5Bi is connected to an input terminal of the current source in the block 4Bi through an upper wiring line 8*b*. Similarly, output terminals of the D/A converter circuits in the blocks 5Ri and 5Gi are connected to input terminals off the current sources in the blocks 4Ri and 4Gi through wiring lines 8*r* and 8*g*, respectively.

Such transistor cell arranging block 3*a* is provided for every 3 pads for B, R and G.

Incidentally, it is possible to arrange the current sources in the blocks 4Bi, 4Ri and 4Gi laterally (in row direction) correspondingly to the pads 2Bi, 2Ri and 2Gi and to arrange the D/A converter circuits in the blocks 5Bi, 5Ri and 5Gi vertically (in column direction) in the order.

By the way, the output stage current source 13 shown in FIG. 6 is constructed with P channel MOS transistors and the D/A converter circuit 11 is constructed with N channel MOS transistors. The connection of the wiring lines shown in FIG. 6 is used in the case where the transistor cells 1 of the D/A converter circuits in the blocks 5Bi, 5Ri and 5Gi are formed by N channel MOS transistors and the transistor cells 1 of the current sources in the blocks 4Bi, 4Ri and 4Gi are formed by P channel MOS transistors. Therefore, an equivalent circuit thereof is that shown in FIG. 5(*b*) with the N channel transistors being changed to P channel transistors.

In this description, the channel type of the transistor cells is not mentioned specifically since the number of transistor cells of each current source block is substantially smaller than that of the D/A converter circuit block. However, in a case where the transistor cells 1 constituting the current sources in the blocks 4Bi, 4Ri and 4Gi and the D/A converter circuits in the blocks 5Bi, 5Ri and 5Gi are, for example, N channel MOS transistors, the output terminals of the D/A converter circuits in the blocks 5Bi, 5Ri and 5Gi are connected to respective input terminals of the current sources in the blocks 4Bi, 4Ri and 4Gi, respectively, through current mirror circuits constructed with P channel MOS transistors formed in a region separated from the region in which the D/A converter circuits in the blocks 5Bi, 5Ri and 5Gi are formed. In such case, the current sources in the blocks 4Bi, 4Ri and 4Gi constructed with the N channel MOS transistors become current sink type unlike the case of the output current source 13 shown in FIG. 6.

Incidentally, the transistors constituting the current sources in the blocks 4Bi, 4Ri and 4Gi do not include those performing the switching operation. In the case of the transistor cell 1 having the equivalent circuit shown in FIG. 5(*b*), the MOS transistor TN in the series circuit 20 is used. That is, the N channel MOS transistor Tr, which becomes the switching circuit, is set in ON state so that the transistor cell 1 substantially includes the transistor for outputting current.

FIG. 2 and FIG. 3 show structures of a transistor cell 1 formed in each of the D/A converter circuits in the blocks 5Bi, 5Ri and 5Gi, which constitute the D/A converter circuit shown in FIG. 5(a).

As shown in FIG. 5(b), the transistor cell 1 of each of the D/A converter circuits in the blocks 5Bi, 5Ri and 5Gi is formed by a series circuit 20 of the transistor TN, which outputs current, and the transistor Tr, which functions as a switch circuit. Therefore, the series circuit 20 in the input side as well as the output side of the current mirror circuit becomes a unit circuit.

Incidentally, in the input side of the current mirror circuit, the drain D of the transistor TN of the series circuit 20 is connected to the input terminal 11a supplied with the reference current and the source S of the transistor Tr of the series circuit 20 is grounded. When the gate of the transistor Tr is biased at a predetermined bias voltage Vb, the transistor Tr becomes not a switch circuit but a resistance circuit as shown by the leftmost transistor cell 1 shown in FIG. 5(a). In a practical circuit, the transistor Tr of the leftmost transistor cell 1 in FIG. 5(a) or the switch circuit SWa in FIG. 6 is replaced by a resistor.

As described previously, the drain of the output transistor TN of the current mirror circuit is connected to the output terminal 5b and the source S of the transistor Tr is grounded. A plurality of transistor cells as the series circuits 20 are connected in parallel correspondingly to the weights of the respective columns of the output transistors.

FIG. 2(a) is a plan view of the transistor cell 1 in which the transistor TN of the transistor cell 1 for each of the D/A converter circuits in the blocks 5Bi, 5Ri and 5Gi is provided as a serpentine type transistor. However, it is not always necessary to use serpentine type transistor for those of the transistor cells 1, which constitute the current sources in the blocks 4Bi, 4Ri and 4Gi.

The transistor TN is formed in a region 21 and the transistor Tr is formed in the region 22. Reference numeral 22s depicts a source region of the transistor Tr and reference numerals 23, 22g and 24 depict a source contact region, a gate region of the transistor Tr and a gate region thereof, respectively. Reference numeral 22d depicts a region, which is a drain region of the transistor Tr as well as a source region of the transistor TN.

Reference numeral 21g and 25 depict a gate region of the transistor TN and a gate contact region thereof, respectively. In a channel forming region 26 which has folded stripe configuration in a plan view, a channel is formed beneath the gate electrode in the gate region 21g, so that, when a predetermined voltage is applied to the gate, a channel (inversion layer), which is serpentine in plan view, is formed in the gate region immediately below the channel forming region 26. A LOCOS (SiO2) region 26L surrounding the region 26 is provided for channel separation. Reference numerals 21d and 27 depict a drain region of the transistor TN and a drain contact region thereof, respectively.

As shown by a cross section taken along a line A-A in FIG. 2(b), the channel forming regions 26 and the LOCOS region 26L are arranged one after the other so that the channels formed in the gate region are limited within the channel forming regions 26. As a result, a folded or serpentine channel can be formed in the gate region. Thus, a current flowing direction in the channel in the gate region become serpentine with which it is possible to reduce W/L of the transistor TN.

Figure 3A:
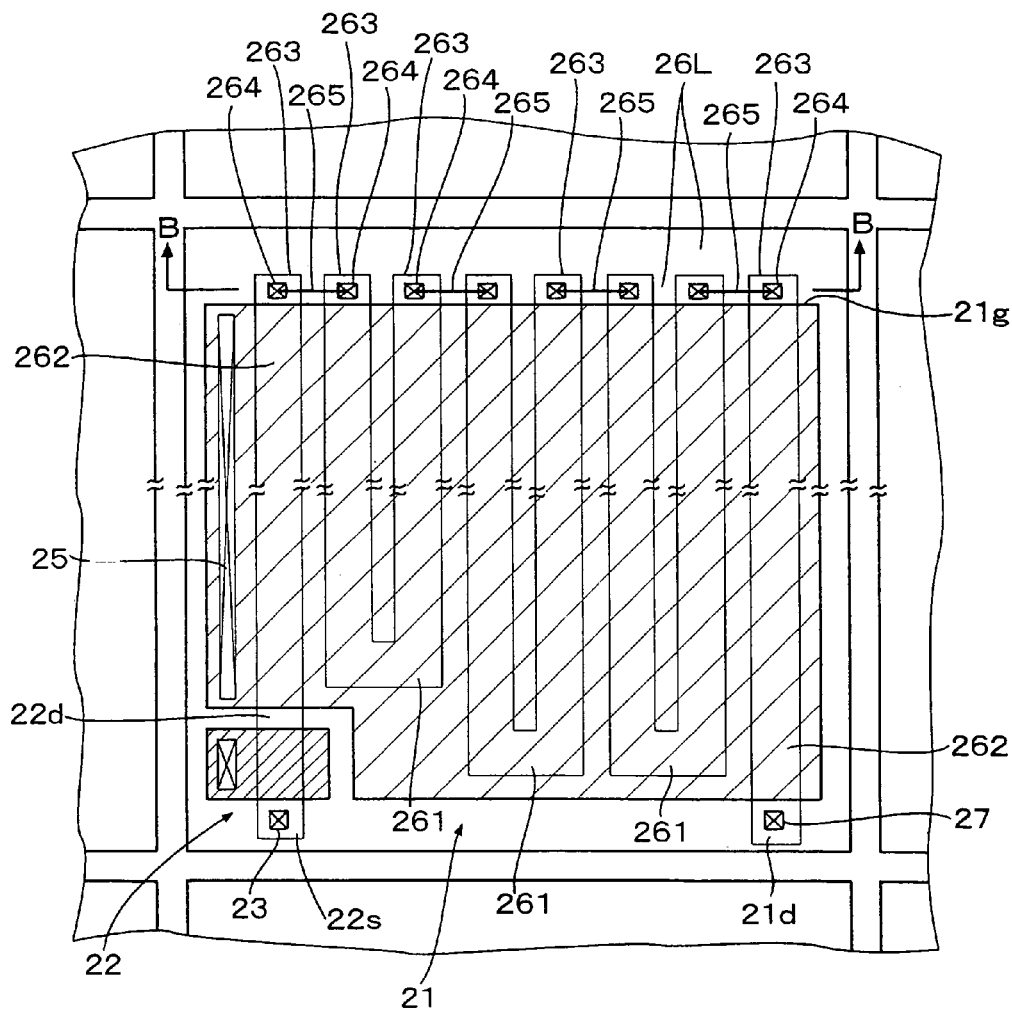
FIG. 3(a) is a plan view of another of the transistor cells of the current mirror type D/A converter circuit.

FIG. 3(a) shows another channel forming region 26, which includes a plurality of U-shaped serpentine channel forming regions 261 arranged in parallel and straight stripes 262 provided on both sides of the U-shaped serpentine channel forming regions 261. That is, the channel forming region 261 corresponds to the channel forming region 26 shown in FIG. 2(a), which is divided to a plurality of regions.

Outsides the gate region 21g, channel contact regions 263 for deriving channel current are provided in end terminals of the serpentine channel forming regions 261 and the stripes 262, respectively. The channel forming regions 261 and 262 are connected in series by connecting the end terminals thereof by wiring lines 265 through a contact region 264 in an upper contact region wiring layer to form a single serpentine channel.

Figure 3B:
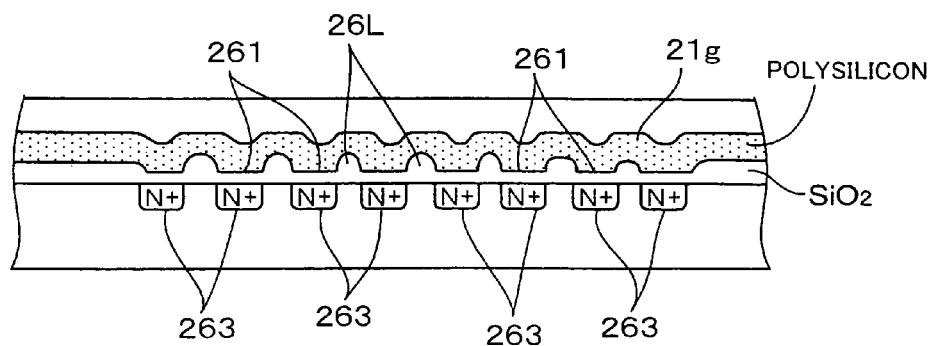
FIG. 3(b) is a cross sectional view taken along a line B-B in FIG. 3(a)

FIG. 3(b) is a cross section taken along a line B-B in FIG. 3(a). The channel contact regions 263 are formed immediately below the end terminals of the serpentine channel forming regions 261 and the stripes 262, respectively, as N+1 and regions.

Figure 4:
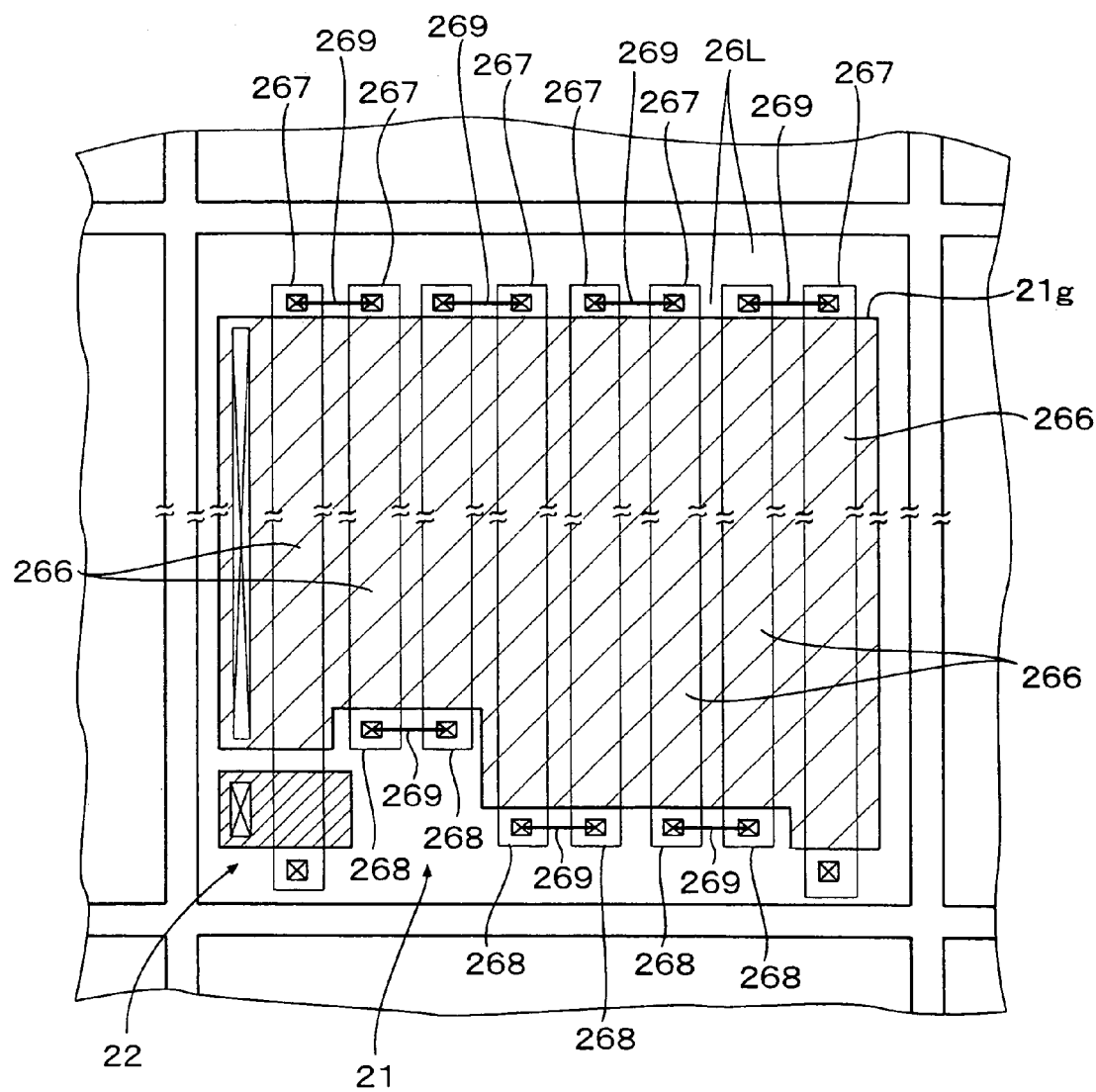
FIG. 4 is a plan view of another of the transistor cells of the current mirror type D/A converter circuit.

FIG. 4 shows another channel forming region in which a plurality of stripe channel forming regions 266 are arranged in parallel. Channel contact regions 267 and 268 are provided in opposite ends of the channel forming regions 266 to connect the regions 266 in series by wiring lines 269. Thus, current flowing in the channel formed in the gate region become serpentine in plan view.

As described hereinbefore, the series circuit 20 shown in FIG. 5(b) may be a series circuit, which includes the transistor TN in downstream side and the transistor Tr in upstream side. Further, it is possible to provide only the transistor TN of the current mirror circuit in the region of each of the D/A converter circuits in the blocks 5Bi, 5Ri and 5Gi as the transistor cell 1 and to provide the transistor Tr of the current mirror circuit in another region. Therefore, the transistor cell 1 may include only one MOS transistor of a serpentine type MOS transistor cell, which is used to output a current.

The MOS transistor TN of the transistor cell 1, which is used to output a current, has substantially rectangular gate region and the current flowing direction in the channel formed in the gate region becomes folded or serpentine. However, it is possible to form a similar channel by making the gate region of the MOS transistor TN serpentine in plan view.

Further, although the serpentine type MOS transistor cell are used to constitute the current mirror circuit as the D/A converter circuit, it is of course possible to constitute the unit transistor of the current mirror circuit of the output stage current source with serpentine MOS transistor cells.

Further, in the layout 10 shown in FIG. 1, each region constituting the current mirror circuit of the D/A converter circuit is constructed with transistor cells each including 2 transistors. However, the transistor cell 1 may be constructed with 2 or more transistors as a unit. The number of transistor cells of the output stage current source is smaller with respect to D/A converter circuit and, since the unit transistors of the current mirror circuit of the output stage current source does not require a switch circuit, the unit transistor may include only one MOS transistor TN.

Further, according to the described embodiment, although the transistor cell 1 is constructed with N channel MOS transistors, it may be constructed with P channel MOS transistors.

What is claimed is:

1. An organic EL drive circuit comprising:
   a D/A converter circuit including a current mirror circuit, wherein said current mirror circuit including a plurality of transistor cells, each said transistor cell including a first MOS transistor;
   wherein said transistor cells comprise a series circuit of said first MOS transistor and a second transistor operable as a switch circuit;
   wherein said first MOS transistors is a serpentine MOS transistor, said second transistor operable as the switch circuit is a second MOS transistor and said serpentine MOS transistor and said second MOS transistor are formed in a rectangular region in plan view;

wherein said transistor cells are assigned as input side transistor cell of said current mirror circuit and a plurality of output side transistor cells of said current mirror circuit, said transistors operable as switch circuits of the plurality of said output side transistor cells being turned ON/OFF in response to 1 bit of display data supplied to gates thereof to generate analog current obtained by D/A conversion of the display data as a total output of said output side transistor cells;

wherein the analog current is an output current to be supplied to terminal pins of an organic EL display panel or a base current on which the output current is generated:

wherein said transistor cell is selected from transistor cells arranged in a matrix in a rectangular transistor arranging block; and wherein said rectangular transistor arranging block has a width in a pad arranging direction substantially corresponding to 3n times a pad pitch in the pad arranging direction, where n is a positive integer, 4 or more of said transistor cells are arranged for the width, a number of said transistor cells are arranged in a direction perpendicular to the pad arranging direction, said transistor cells are selected such that said D/A converter circuits for R, G and B in said transistor arranging block are sequentially formed in a direction perpendicular to said pad arranging direction as an IC.

2. An organic EL display device comprising:

a D/A converter circuit including a current mirror circuit and an organic EL display panel having terminal pins supplied with analog currents converted by said D/A converter circuit or a drive current generated on the basis of the analog current, wherein said current mirror circuit includes a plurality of transistor cells, each said transistor cell including a first MOS transistor, wherein said transistor cells comprises a series circuit of said first MOS transistor and a transistor operable as a switch circuit;

wherein said first MOS transistor is a serpentine MOS transistor, said transistor is operable as the switch circuit is a second MOS transistor and said serpentine MOS transistor and said second MOS transistor are formed in a rectangular region in plan view;

wherein said transistor cells are assigned as input side transistor cell of said current mirror circuit and a plurality of output side transistor cells of said current mirror circuit, said transistors operable as switch circuits of the plurality of said output side transistor cells are turned ON/OFF in response to 1 bit of a display data supplied to gates thereof to generate analog current obtained by D/A conversion of the display data as a total output of said output side transistors;

wherein said transistor cell is selected from transistor cells arranged in a matrix in a rectangular transistor arranging block; and wherein said rectangular transistor arranging block has a width in a pad arranging direction substantially corresponding to 3n times a pad pitch in the pad arranging direction, where n is a positive integer, 4 or more of said transistor cells are arranged for the width, a number of said transistor cells are arranged in a direction perpendicular to the pad arranging direction, said transistor cells are selected such that said D/A convener circuits for R, G and B in said transistor arranging block are sequentially formed in a direction perpendicular to said pad arranging direction as an IC.

* * * * *